(12) United States Patent
Liu

(10) Patent No.: US 10,403,654 B2
(45) Date of Patent: *Sep. 3, 2019

(54) MASK FOR MANUFACTURING TFT IN 4M PRODUCTION PROCESS AND TFT ARRAY MANUFACTURING METHOD OF 4M PRODUCTION PROCESS

(71) Applicant: Shenzhen China Star Optoelectronics Semiconductor Display Technology Co., Ltd., Shenzhen (CN)

(72) Inventor: Xiaodi Liu, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 106 days.

This patent is subject to a terminal disclaimer.

(21) Appl. No.: 15/529,506

(22) PCT Filed: Apr. 14, 2017

(86) PCT No.: PCT/CN2017/080510
§ 371 (c)(1),
(2) Date: May 25, 2017

(87) PCT Pub. No.: WO2018/170973
PCT Pub. Date: Sep. 27, 2018

(65) Prior Publication Data
US 2018/0308880 A1 Oct. 25, 2018

(30) Foreign Application Priority Data
Mar. 22, 2017 (CN) .......................... 2017 1 0180169

(51) Int. Cl.
*H01L 27/12* (2006.01)
*H01L 29/66* (2006.01)
(Continued)

(52) U.S. Cl.
CPC ........ *H01L 27/1288* (2013.01); *H01L 21/308* (2013.01); *H01L 27/127* (2013.01);
(Continued)

(58) Field of Classification Search
CPC ............. H01L 27/1288; H01L 27/1225; H01L 27/127; H01L 27/1292; H01L 21/308; H01L 29/66742
(Continued)

(56) References Cited

U.S. PATENT DOCUMENTS

2004/0134878 A1* 7/2004 Matsushita ......... G02F 1/13458
216/23
2007/0155080 A1* 7/2007 Yoon ................... H01L 27/1214
438/197
(Continued)

FOREIGN PATENT DOCUMENTS

| CN | 102931138 A | 2/2013 |
| CN | 104157609 A | 11/2014 |
| CN | 106340489 A | 1/2017 |

*Primary Examiner* — Long K Tran
(74) *Attorney, Agent, or Firm* — Leong C. Lei

(57) ABSTRACT

The present invention provides a mask for manufacturing a TFT in a 4M production process and a TFT array manufacturing method of a 4M production process. For the mask for manufacturing a TFT in a 4M production process, in a TFT layout structure of the mask, a line pattern is provided adjacent to an outer edge of a TFT pattern to extend along the outer edge of the TFT pattern. The present invention also provides a corresponding TFT array manufacturing method of the 4M production process, which uses the mask of the present invention to serve as a mask for a second mask-based process. The mask for manufacturing a TFT in a 4M production process according to the present invention allows for achievement of an edge-thinned structure through varia- (Continued)

tion of edge exposure of the mask so as to make plasma etching more easily performed on such a structure to thereby reduce residues of amorphous silicon and heavily-doped silicon on an edge of a second metal layer. The TFT array manufacturing method of the 4M production process of the present invention is such that the mask of the present invention is used in combination with a 4M production process to alleviate the problems of residues of amorphous silicon and heavily doped silicon on an edge of a second metal layer.

8 Claims, 7 Drawing Sheets

(51) Int. Cl.
  *H01L 21/308* (2006.01)
  *H01L 21/027* (2006.01)

(52) U.S. Cl.
  CPC ...... *H01L 27/1225* (2013.01); *H01L 27/1292* (2013.01); *H01L 29/66742* (2013.01); *H01L 29/66969* (2013.01); *H01L 21/0273* (2013.01)

(58) Field of Classification Search
  USPC ..... 257/72; 438/48, 128, 149, 151, 157, 283
  See application file for complete search history.

(56) References Cited

U.S. PATENT DOCUMENTS

2010/0289977 A1* 11/2010 Liu .................. G02F 1/1362
  349/44
2014/0011368 A1* 1/2014 Obu .................. H01L 21/02304
  438/763

\* cited by examiner

MASK FOR MANUFACTURING TFT IN 4M PRODUCTION PROCESS AND TFT ARRAY MANUFACTURING METHOD OF 4M PRODUCTION PROCESS

BACKGROUND OF THE INVENTION

1. Field of the Invention

The present invention relates to the field of liquid crystal displays, and more particular to a mask for manufacturing a thin-film transistor (TFT) in a 4M (Four-Mask) production process and a TFT array manufacturing method of a 4M production process.

2. The Related Arts

Flat panel display devices, such as liquid crystal displays (LCDs), have various advantages, such as high image quality, low power consumption, thin device body, and a wide range of applications, and are thus widely used in various consumer electronic products, such as mobile phones, televisions, personal digital assistants (PDAs), digital cameras, notebook computers, and desktop computers, making them a main stream of display devices.

To reduce costs and increase yield, manufacturers and research institutes of display array substrates have devoted themselves to continuous development of new processes and techniques of production, among which 4M (four masks) processes have taken the place of 5M (five masks) processes and become the new trend of study and production in this field. The 4M production processes suffer issue of residues of amorphous silicon and heavily doped silicon on edges of a second layer of metal, where the second layer of metal is the metal of source/drain metal layer. Such issues affect optical stability and electrical performance, aperture ratio, power consumption, and reliability of thin-film transistors (TFT). This is caused by a patterning operation conducted with a half-tone mask (HTM) or a gray-tone mask (GTM).

Referring to FIG. 1, which is a schematic view showing a TFT layout structure for a second mask-based process of a conventional 4M production process. A TFT pattern 1 shown in the layout corresponds to a source/drain area of a panel, which undergoes exposure and development in a photoresist layer in a second mask-based process.

Referring to FIG. 2, which is a schematic view illustrating a conventional 4M production process, a second mask-based process of the conventional 4M production process is demonstrated. The conventional 4M production process generally comprises the following:

a first mask-based process, in which a gate layer 12 is formed on a glass substrate 11 and the gate layer 12 is patterned; and then, a gate insulation layer 13, an active layer, a source/drain layer 16, and a photoresist layer 17 are formed, wherein the active layer comprises a channel layer 14 and a contact layer 15;

a second mask-based process, in which a gray-tone mask is used as a second mask to subject the photoresist layer 17 to exposure and development; a first wet etching operation is carried out to pattern the source/drain layer 16 to form metal lines structures of source and drain areas and an active area; a first dry etching operation is carried out to form an island structure of the active layer, namely patterned channel layer 14 and contact layer 15; an oxygen ashing operation is carried out to reduce the thickness of the photoresist layer 17 in order to expose the source/drain layer 16 in the channel area; a second wet etching operation is conducted to pattern the source and drain electrodes; and a second dry etching operation is applied to etch the active layer, namely etching and cutting off the channel layer 14 and the contact layer 15 to form a thin-film transistor structure;

a third mask-based process, in which a passivation layer is formed and the passivation layer is patterned; and a fourth mask-based process, in which a transparent electrode layer is formed and the transparent electrode layer is patterned.

SUMMARY OF THE INVENTION

An objective of the present invention is to provide a mask for manufacturing a thin-film transistor (TFT) in a 4M production process to alleviate or eliminate residues of amorphous silicon and heavily doped silicon on edges of a second metal layer.

Another objective of the present invention is to provide a TFT array manufacturing method of a 4M production process that alleviates or eliminates residues of amorphous silicon and heavily doped silicon on edges of a second metal layer.

To achieve the above objectives, the present invention provides a mask for manufacturing a TFT in a 4M production process, wherein in a TFT layout structure of the mask, a line pattern is provided adjacent to an outer edge of a TFT pattern to extend along the outer edge of the TFT pattern.

In the above mask, the line pattern and the TFT pattern do not intersect each other, or alternatively, the line pattern and the TFT pattern intersect each other.

The present invention also provides a TFT array manufacturing method of a 4M production process, which uses the above mask to serve as a mask for a second mask-based process.

The TFT array manufacturing method of the 4M production process comprises:

Step 10: in a first mask-based process, making a gate layer on a glass substrate and patterning the gate layer; and then, making a gate insulation layer, an active layer, a source/drain layer, and a photoresist layer;

Step 20: in a second mask-based process, subjecting the photoresist layer to exposure and development; conducting a first wet etching operation to pattern the source/drain layer to form metal line structures of source and drain areas and an active area; conducting a first dry etching operation to form an active layer island structure; conducting an oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

Step 30: in a third mask-based process, making a passivation layer and patterning the passivation layer; and Step 40: in a fourth mask-based process, making a transparent electrode layer and patterning the transparent electrode layer.

In the above TFT array manufacturing method, Step 20 further comprises two oxygen ashing operation and is carried out as follows: in the second mask-based process, subjecting the photoresist layer to exposure and development; conducting a first wet etching operation to pattern the source/drain layer to form metal line structures of source and drain areas and an active area; conducting a first oxygen ashing operation to reduce a size of trailing of the active layer on edges of the source/drain metal layer; conducting a first dry etching operation to form an active layer island structure; conducting a second oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure.

In the above TFT array manufacturing method, the TFT array is a TFT array of a display zone or a gate-driver-on-array (GOA) circuit zone.

In the above TFT array manufacturing method, the second mask comprises a gray-tone mask or a half-tone mask.

In the above TFT array manufacturing method, the making of the gate layer is conducted through puttering, a sol-gel process, atomic layer deposition, evaporation, or printing.

In the above TFT array manufacturing method, a material of the gate layer comprises Cu, Cu/Mo, Mo/Cu/Mo, MoNb/Cu/MoNb, Ti/Cu/Ti, Al, Al/Mo, or Mo/Al/Mo.

In the above TFT array manufacturing method, the making of the gate insulation layer is conducted through plasma enhanced chemical vapor deposition, atmospheric pressure chemical vapor deposition, or sputtering.

In the above TFT array manufacturing method, a material of the gate insulation layer comprises silicon nitride, silicon oxide, silicon oxynitride, aluminum oxide, or hafnium oxide.

In the above TFT array manufacturing method, the active layer comprises a channel layer and a contact layer.

In the above TFT array manufacturing method, the channel layer and the contact layer are formed through depositing a silicon base and conducting sputtering to form a metal oxide semiconductor layer or conducting atomic layer deposition to form a metal oxide semiconductor layer.

In the above TFT array manufacturing method, the metal oxide comprises indium gallium zinc oxide (IGZO), indium zinc oxide (IZO), or indium tin zinc oxide (ITZO).

The present invention also provides a TFT array manufacturing method of a 4M production process, which uses the above mask to serve as a mask for a second mask-based process, comprising:

Step 10: in a first mask-based process, making a gate layer on a glass substrate and patterning the gate layer; and then, making a gate insulation layer, an active layer, a source/drain layer, and a photoresist layer;

Step 20: in a second mask-based process, subjecting the photoresist layer to exposure and development; conducting a first wet etching operation to pattern the source/drain layer to form metal line structures of source and drain areas and an active area; conducting a first dry etching operation to form an active layer island structure; conducting an oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

Step 30: in a third mask-based process, making a passivation layer and patterning the passivation layer; and Step 40: in a fourth mask-based process, making a transparent electrode layer and patterning the transparent electrode layer;

wherein Step 20 further comprises two oxygen ashing operation and is carried out as follows: in the second mask-based process, subjecting the photoresist layer to exposure and development; conducting a first wet etching operation to pattern the source/drain layer to form metal line structures of source and drain areas and an active area; conducting a first oxygen ashing operation to reduce a size of trailing of the active layer on edges of the source/drain metal layer; conducting a first dry etching operation to form an active layer island structure; conducting a second oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

wherein the TFT array is a TFT array of a display zone or a gate-driver-on-array (GOA) circuit zone;

wherein the second mask comprises a gray-tone mask or a half-tone mask;

wherein the making of the gate layer is conducted through puttering, a sol-gel process, atomic layer deposition, evaporation, or printing; and wherein a material of the gate layer comprises Cu, Cu/Mo, Mo/Cu/Mo, MoNb/Cu/MoNb, Ti/Cu/Ti, Al, Al/Mo, or Mo/Al/Mo.

In summary, the mask for manufacturing a TFT in a 4M production process according to the present invention allows for achievement of an edge-thinned structure through variation of edge exposure of the mask so as to make plasma etching more easily performed on such a structure to thereby reduce residues of amorphous silicon and heavily-doped silicon on an edge of a second metal layer. The TFT array manufacturing method of the 4M production process of the present invention is such that the mask of the present invention is used in combination with a 4M production process to alleviate the problems of residues of amorphous silicon and heavily doped silicon on an edge of a second metal layer.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

Figure 6:
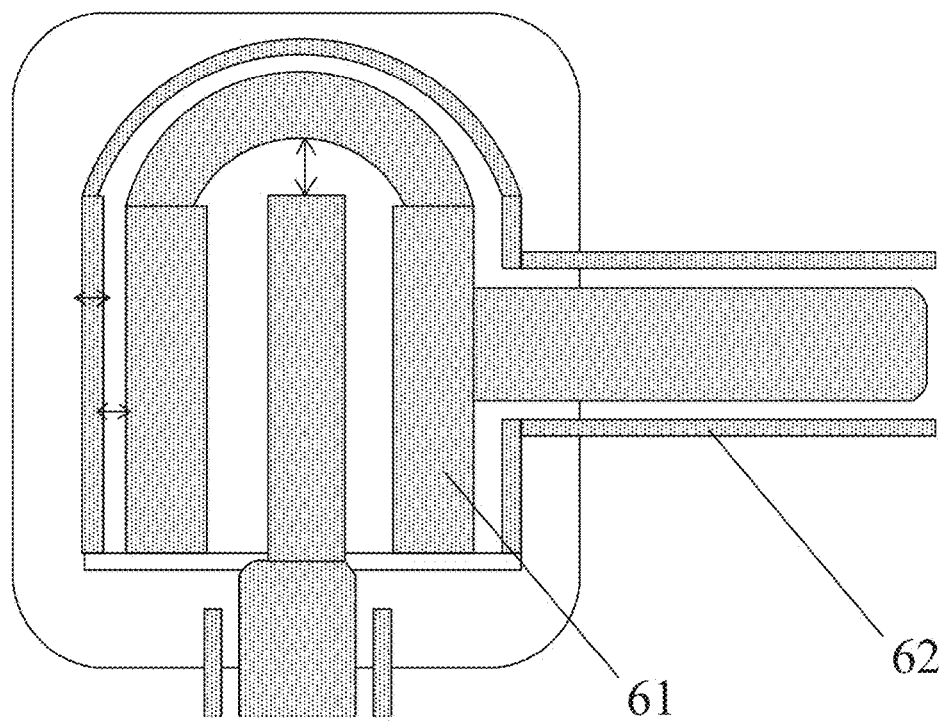
FIGS. 6 and 7 are schematic views respectively illustrating TFT layout structures of first and second preferred embodiments of the mask for manufacturing a TFT in a 4M production process according to the present invention.
Figure 7:
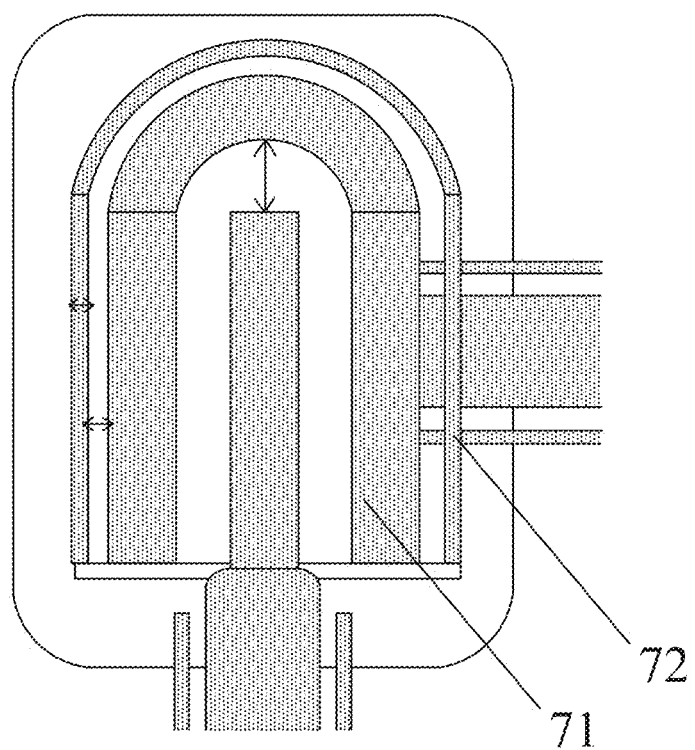

Referring to FIGS. 6 and 7, schematic views are provided for respectively illustrating thin-film transistor (TFT) layouts of first and second preferred embodiments a the mask for manufacturing a TFT in a 4M production process according to the present invention. For the mask for manufacturing a TFT in a 4M production process provided in accordance with the present invention, in TFT layout structures of the mask, a line pattern 62 is provided adjacent to an outer edge of a TFT pattern 61 to extend along the outer edge of the TFT pattern 61; and a line pattern 72 is provided adjacent to an outer edge of a TFT pattern 71 to extend along the outer edge of the TFT pattern 71. In FIG. 6, the line pattern 62 and the TFT pattern 61 do not intersect; and in FIG. 7, the line pattern 72 and the TFT pattern 71 intersect each other. FIGS. 6 and 7 respectively correspond to two different compensation value design methods for providing more uniform device structure designs.

Figure 4:
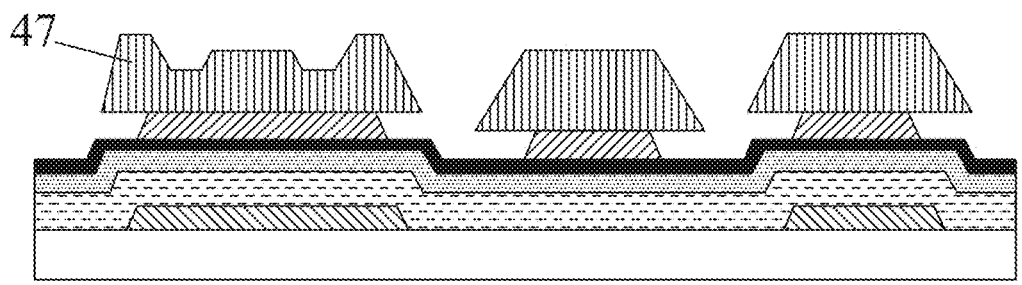
FIG. 4 is a schematic view illustrating a 4M production process using a conventional mask.
Figure 5:
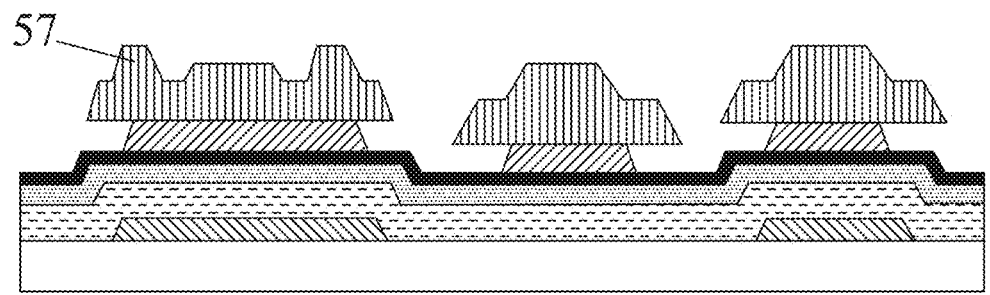
FIG. 5 is a schematic view illustrating a 4M production process using a mask for manufacturing a TFT in a 4M production process according to the present invention.

Referring to FIGS. 4 and 5, FIG. 4 is a schematic view illustrating a 4M production process using a conventional mask; and FIG. 5 is a schematic view illustrating a 4M production process using a mask for manufacturing a TFT in a 4M production process according to the present invention. An effect of the mask according to the present invention can be appreciated through comparison between a photoresist layer 47 and a photoresist layer 57. The present invention is made to achieve an edge-thinned structure through variation of edge exposure of the mask so as to make plasma etching more easily performed on such a structure to thereby achieve alleviation of residues of amorphous silicon and heavily-doped silicon on an edge of a second metal layer. Specifics of the design involve, on the mask, metal line width and metal line distance of a peripheral area of a TFT and a second metal layer so as to achieve an optimum result of elimination of residues of amorphous silicon and heavily-doped silicon.

Figure 8:
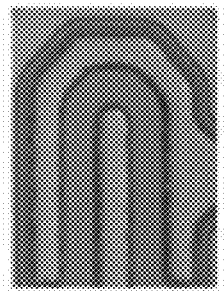
FIG. 8 is a picture showing a TFT structure manufactured with a conventional mask.
Figure 9:
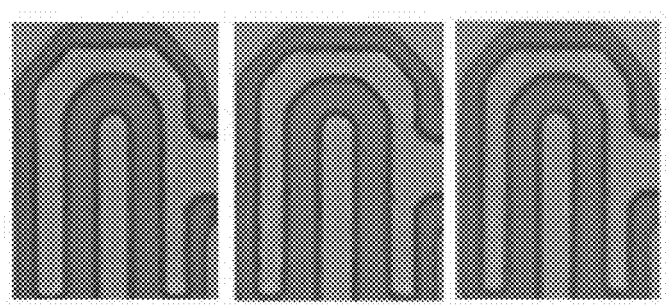
FIG. 9 is a picture showing a TFT structure manufactured with the mask for manufacturing a TFT in a 4M production process according to the present invention.

Referring to FIGS. 8 and 9, FIG. 8 is a picture showing a TFT structure manufactured with a conventional mask; and FIG. 9 is a picture showing a TFT structure manufactured with the mask for manufacturing a TFT in a 4M production process according to the present invention. Comparison between FIGS. 8 and 9 shows that the mask of the present invention achieves the advantages of improving optical stability and electrical performance, aperture ratio and reliability, and reducing power consumption of the TFT to thus improve overall performance of an array substrate, allowing for, on the basis of an existing production process, successful reduction of heavily doped residues in the channel area by around 0.5 um, and even achieving a more significant result if used in combination with a matched production process.

The mask for manufacturing a TFT in a 4M production process according to the present invention helps alleviate or eliminate residues of amorphous silicon and heavily doped silicon on an edge of a second metal layer and applying the mask to an existing 4M production process would achieve a corresponding TFT array manufacturing method for a 4M production process, which allows for, on the basis of an existing production process without alteration of the production process, successful elimination of heavily doped residue on an outside of the second metal layer, and would achieve a more significant result if used in combination with a new production process.

Figure 1:
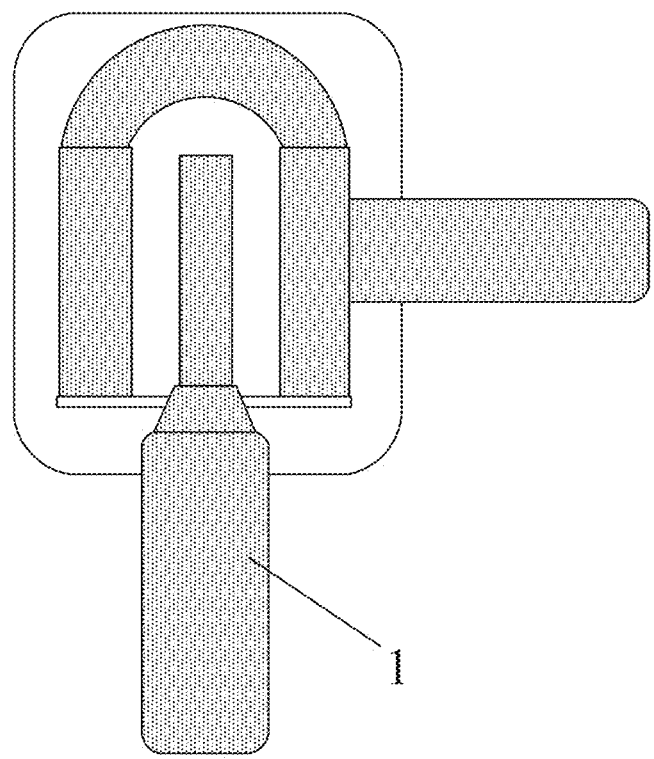
FIG. 1 is a schematic view showing a thin-film transistor (TFT) layout structure for a second mask-based process of a conventional 4M production process.
Figure 2:
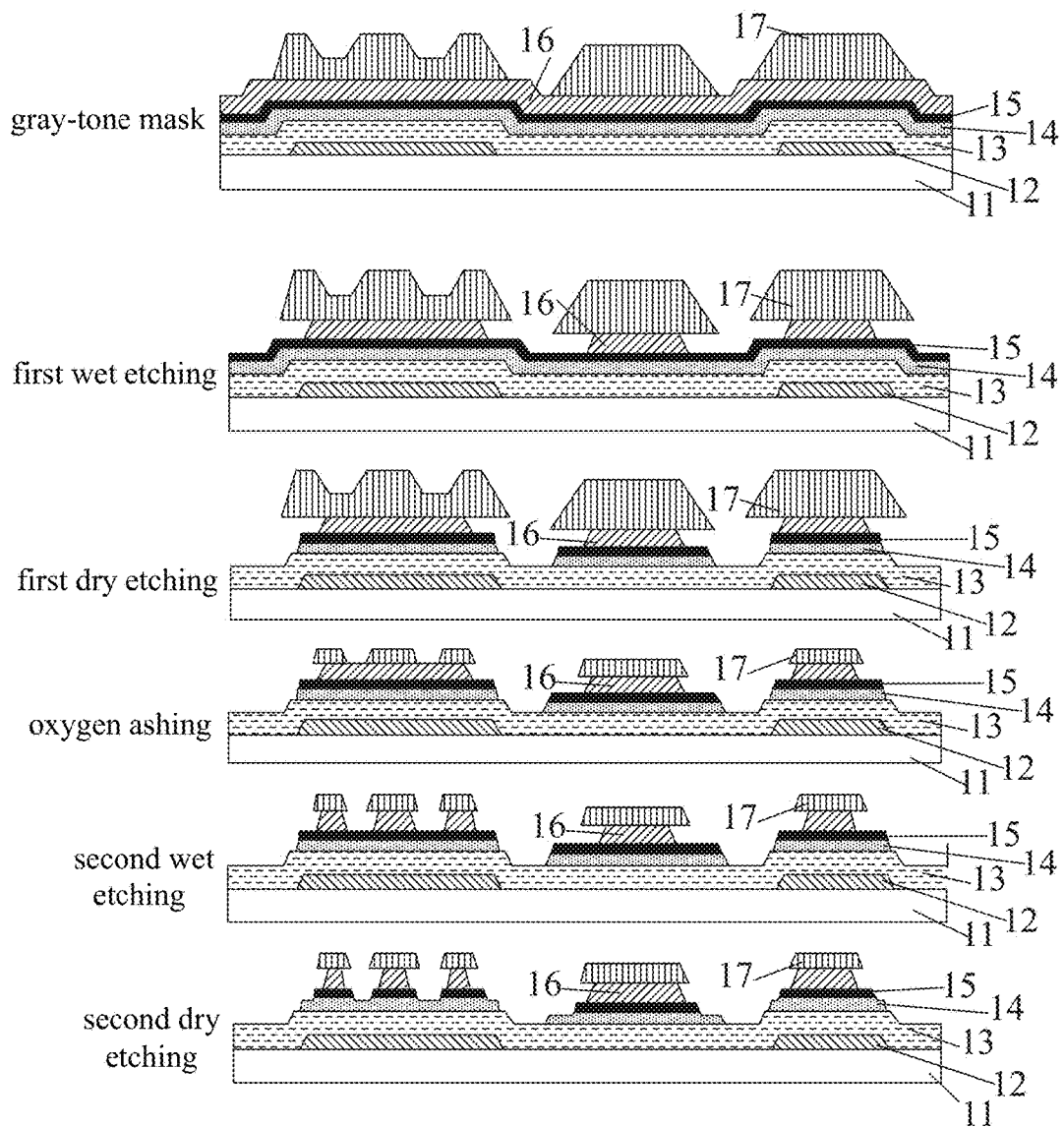
FIG. 2 is a schematic view demonstrating a conventional 4M production process.
Figure 3:
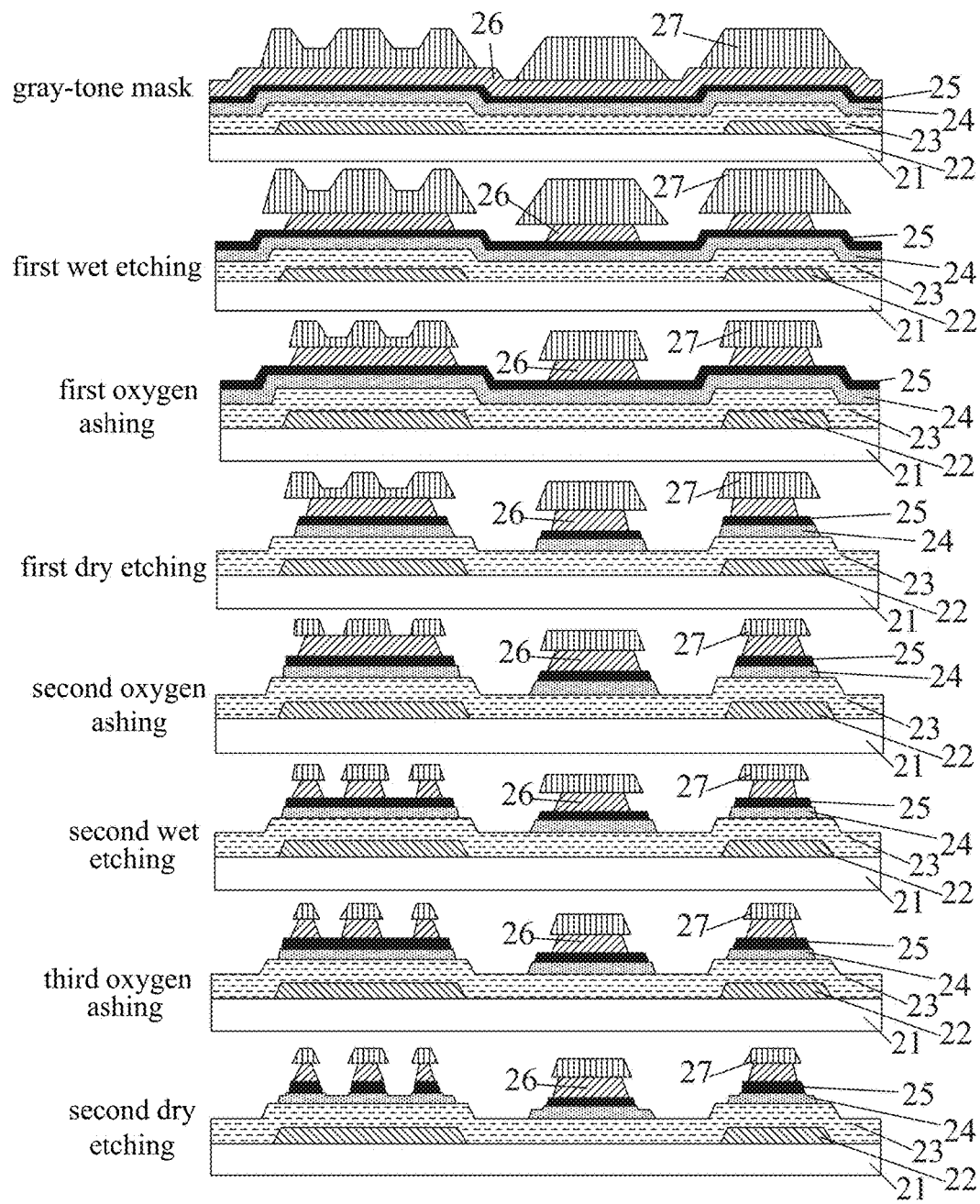
FIG. 3 is a schematic view demonstrating a preferred embodiment of a TFT array manufacturing method of a 4M production process according to the present invention.

Referring to FIG. 3, which is a schematic view demonstrating a preferred embodiment of a TFT array manufacturing method of a 4M production process according to the present invention, in which the mask is used in combination with the new method, to illustrate a second mask-based process, which is the part in which an existing process is optimized.

The TFT array manufacturing method of the 4M production process generally comprises:

Step 10: in a first mask-based process, making a gate layer on a glass substrate and patterning the gate layer; and then, making a gate insulation layer, an active layer, a source/drain layer, and a photoresist layer.

In the first mask-based process that is conducted before the second mask-based process, the gate layer 22 is made on the glass substrate 21 and the gate layer 22 is patterned; and then, the gate insulation layer 23, the active layer, the source/drain layer 26, and the photoresist layer 27 are made, wherein the active layer comprises the channel layer 24 and the contact layer 25.

Step 20: afterwards, in the second mask-based process that uses a gray-tone mask:

applying a gray-tone mask to subject the photoresist layer 27 to exposure and development;

conducting a first wet etching operation to pattern the source/drain layer 26 to form the metal line structures of the source and drain areas and the active area;

conducting a first oxygen ashing operation to reduce the size of the trailing of the active layer on edges of the source/drain metal layer 26, wherein the purpose of additionally including this oxygen ashing operation is to reduce residue of amorphous silicon;

conducting a first dry etching operation to form the active layer island structure, which is patterning of the channel layer 24 and the contact layer 25;

conducting a second oxygen ashing operation to reduce the thickness of the photoresist layer 27 in order to expose the portions of the source/drain layer 16 in the channel area;

conducting a second wet etching operation to pattern the source and the drain;

conducting a third oxygen ashing operation to reduce the trailing of he contact layer, wherein the purpose of additionally including this oxygen ashing operation is to reduce residue of heavily doped silicon; and conducting a second dry etching operation to etch the active layer, which is etching and cutting off the channel layer 24 and the contact layer 25 to form the thin-film transistor structure.

Step 30: in a third mask-based process, making a passivation layer and patterning the passivation layer; and Step 40: in a fourth mask-based process, making a transparent electrode layer and patterning the transparent electrode layer.

The TFT array manufacturing method of the 4M production process according to the present invention specifically relates to the development of a backplane of optimized 4M production art, which is applicable to the development and display of a TFT array in a display zone or a gate-driver-on-array (GOA) circuit zone and optimization of circuit performance. The present invention comprises making of gate electrode, which can be achieved by applying methods such as sputtering, sol-gel process, atomic layer deposition, evaporation, and printing to make an electrode material, such as Cu, Cu/Mo, Mo/Cu/Mo, MoNb/Cu/MoNb, Ti/Cu/Ti, Al, Al/Mo, and Mo/Al/Mo, followed by patterning. The present invention comprises making of a gate insulation layer, which specifically comprises applying plasma enhanced chemical vapor deposition, atmospheric pressure chemical vapor deposition, or sputtering to make a dielectric material, such as silicon nitride, silicon oxide, silicon oxynitride, aluminum oxide, and hafnium oxide. The present invention comprises depositing a silicon base and depositing, through sputtering and atomic layer deposition, a metal oxide semiconductor layer, such as indium gallium zinc oxide (IGZO), indium zinc oxide (IZO), and indium tin zinc oxide (ITZO) to form the channel layer and the contact layer. The second mask can be a gray-tone mask or a half-tone mask. Deposition of the passivation layer, etching of contact holes, and extending of the transparent electrode, such as indium tin oxide (ITO), conducted in Steps 30 and 40 can be carried out with known techniques and repeated description will be omitted herein.

In summary, the present invention provides a mask for manufacturing a TFT in a 4M production process, which allows for achievement of an edge-thinned structure through variation of edge exposure of the mask so as to make plasma etching more easily performed on such a structure to thereby reduce residues of amorphous silicon and heavily-doped silicon on an edge of a second metal layer to thus improve overall performance of an array substrate, allowing for, on the basis of an existing production process, successful reduction of heavily doped residues on the outside of the second metal layer, and even achieving a more significant result if used in combination with new art. The present invention provides a TFT array manufacturing method of a 4M production process, so that the mask according to the present invention is used in combination with a 4M production process to alleviate the problems of residues of amorphous silicon and heavily doped silicon on an edge of a second metal layer.

Based on the description given above, those having ordinary skills in the art may easily contemplate various changes and modifications of the technical solution and the technical ideas of the present invention. All these changes and modifications are considered falling within the protection scope of the present invention as defined in the appended claims.

What is claimed is:

1. A thin-film transistor (TFT) array manufacturing method of a 4M (4 mask) production process, using a mask, which comprises a TFT layout structure having a line pattern provided adjacent to an outer edge of a TFT pattern to extend along the outer edge of the TFT pattern, to serve as a mask for a second mask-based process, the TFT array manufacturing method comprising:

Step 10: in a first mask-based process, making a gate layer on a glass substrate and patterning the gate layer; and then, making a gate insulation layer, an active layer, a source/drain layer, and a photoresist layer;

Step 20: in a second mask-based process, subjecting the photoresist layer to exposure and development; conducting a first wet etching operation to pattern the source/drain layer to form metal line structures of source and drain areas and an active area; conducting a first dry etching operation to form an active layer island structure; conducting an oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

Step 30: in a third mask-based process, making a passivation layer and patterning the passivation layer; and Step 40: in a fourth mask-based process, making a transparent electrode layer and patterning the transparent electrode layer;

wherein Step 20 further comprises two oxygen ashing operation and is carried out as follows: in the second mask-based process, subjecting the photoresist layer to exposure and development; conducting a first wet etching operation to pattern the source/drain layer to form metal line structures of source and drain areas and an active area; conducting a first oxygen ashing operation to reduce a size of trailing of the active layer on edges of the source/drain metal layer; conducting a first dry etching operation to form an active layer island structure; conducting a second oxygen ashing operation to reduce a thickness of the photoresist layer in order to expose portions of the source/drain layer in a channel area; conducting a second wet etching operation to pattern a source and a drain; conducting a third oxygen ashing operation to reduce trailing of the contact layer; and conducting a second dry etching operation to etch the active layer so as to form a thin-film transistor structure;

wherein the TFT array is a TFT array of a display zone or a gate-driver-on-array (GOA) circuit zone;

wherein the second mask comprises a gray-tone mask or a half-tone mask;

wherein the making of the gate layer is conducted through puttering, a sol-gel process, atomic layer deposition, evaporation, or printing; and wherein a material of the gate layer comprises Cu, Cu/Mo, Mo/Cu/Mo, MoNb/Cu/MoNb, Ti/Cu/Ti, Al, Al/Mo, or Mo/Al/Mo.

2. The TFT array manufacturing method of the 4M production process as claimed in claim 1, wherein the line pattern and the TFT pattern of the TFT layout structure of the mask do not intersect each other.

3. The TFT array manufacturing method of the 4M production process as claimed in claim 1, wherein the making of the gate insulation layer is conducted through plasma enhanced chemical vapor deposition, atmospheric pressure chemical vapor deposition, or sputtering.

4. The TFT array manufacturing method of the 4M production process as claimed in claim 3, wherein a material of the gate insulation layer comprises silicon nitride, silicon oxide, silicon oxynitride, aluminum oxide, or hafnium oxide.

5. The TFT array manufacturing method of the 4M production process as claimed in claim 1, wherein the active layer comprises a channel layer and a contact layer.

6. The TFT array manufacturing method of the 4M production process as claimed in claim 5, wherein the channel layer and the contact layer are formed through depositing a silicon base and conducting sputtering to form a metal oxide semiconductor layer or conducting atomic layer deposition to form a metal oxide semiconductor layer.

7. The TFT array manufacturing method of the 4M production process as claimed in claim 6, wherein the metal oxide comprises indium gallium zinc oxide (IGZO), indium zinc oxide (IZO), or indium tin zinc oxide (ITZO).

8. The TFT array manufacturing method of the 4M production process as claimed in claim 1, wherein the line pattern and the TFT pattern of the TFT layout structure of the mask intersect each other.

* * * * *